United States Patent
Akin

(10) Patent No.: US 10,017,269 B2
(45) Date of Patent: Jul. 10, 2018

(54) SYSTEMS FOR GENERATING AUXILIARY ELECTRICAL POWER FOR JET AIRCRAFT PROPULSION SYSTEMS

(71) Applicant: United Technologies Corporation, Hartford, CT (US)

(72) Inventor: John Akin, Wethersfield, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 336 days.

(21) Appl. No.: 14/946,151

(22) Filed: Nov. 19, 2015

(65) Prior Publication Data

US 2016/0075438 A1    Mar. 17, 2016

Related U.S. Application Data

(63) Continuation of application No. PCT/US2014/053190, filed on Aug. 28, 2014.

(Continued)

(51) Int. Cl.
*B64D 33/04*    (2006.01)
*B64D 33/00*    (2006.01)
(Continued)

(52) U.S. Cl.
CPC ............. *B64D 33/00* (2013.01); *B64D 27/16* (2013.01); *F02C 7/00* (2013.01); *H01L 35/02* (2013.01);
(Continued)

(58) Field of Classification Search
CPC .... B64D 2221/00; B64D 27/16; B64D 33/00; B64D 33/04; F02C 7/00; F02C 7/32; H01L 35/02; H01L 35/30; H02K 7/1823
(Continued)

(56) References Cited

U.S. PATENT DOCUMENTS 6,443,395 B1    9/2002  Porte et al.
8,962,968 B2 *  2/2015  Brillet .................... B64D 41/00
                                                    136/200

(Continued)

FOREIGN PATENT DOCUMENTS

DE    102007036930    4/2009

OTHER PUBLICATIONS

International Preliminary Report on Patentability dated Mar. 22, 2016 in PCT Application No. PCT/US2014/053190.
(Continued)

*Primary Examiner* — William Hernandez
(74) *Attorney, Agent, or Firm* — Snell & Wilmer, L.L.P.

(57) ABSTRACT

An aircraft jet propulsion system is disclosed. The aircraft jet propulsion system may comprise a thermoelectric generator array ("TEG" array) coupled to a portion of the aircraft jet propulsion system, wherein the TEG array converts heat energy to electrical energy, and supplies power to the aircraft jet propulsion system, wherein the electrical energy is supplied to a power supply. The aircraft jet propulsion system may comprise an alternator that generates less energy than is required to power the aircraft jet propulsion system. The TEG array may supplement the energy generated by the alternator. The energy generated by the TEG array and the energy generated by the alternator may be sufficient to power the aircraft jet propulsion system and/or the electrical energy generated by the TEG array may be sufficient to power to aircraft jet propulsion system.

17 Claims, 4 Drawing Sheets

Related U.S. Application Data

(60) Provisional application No. 61/878,494, filed on Sep. 16, 2013.

(51) Int. Cl.
*F02C 7/00* (2006.01)
*H01L 35/02* (2006.01)
*B64D 27/16* (2006.01)
*H01L 35/30* (2006.01)
*H02K 7/18* (2006.01)

(52) U.S. Cl.
CPC .......... *H01L 35/30* (2013.01); *H02K 7/1823* (2013.01); *B64D 2221/00* (2013.01); *Y02T 50/671* (2013.01)

(58) Field of Classification Search
USPC .......................................................... 307/9.1
See application file for complete search history.

(56) References Cited

U.S. PATENT DOCUMENTS

| | | | | |
|---|---|---|---|---|
| 9,018,512 | B2* | 4/2015 | Kwok | F02C 6/18 |
| | | | | 136/205 |
| 2004/0045594 | A1* | 3/2004 | Hightower | F02C 6/18 |
| | | | | 136/205 |
| 2005/0022855 | A1* | 2/2005 | Raver | F02C 6/18 |
| | | | | 136/205 |
| 2007/0018038 | A1 | 1/2007 | Jarmon et al. | |
| 2009/0159110 | A1 | 6/2009 | Kwok et al. | |
| 2011/0283712 | A1 | 11/2011 | Brillet | |
| 2012/0031067 | A1* | 2/2012 | Sundaram | F01D 25/30 |
| | | | | 60/39.01 |
| 2012/0118345 | A1* | 5/2012 | Stoia | F01D 5/284 |
| | | | | 136/205 |
| 2012/0308369 | A1 | 12/2012 | Mheshwari et al. | |
| 2013/0061605 | A1* | 3/2013 | de Rochemont | B64D 15/12 |
| | | | | 62/3.5 |
| 2013/0205798 | A1* | 8/2013 | Kwok | F02K 1/00 |
| | | | | 60/783 |
| 2014/0174097 | A1* | 6/2014 | Hammer | F01D 15/10 |
| | | | | 60/783 |
| 2014/0345281 | A1* | 11/2014 | Galbraith | B60K 6/24 |
| | | | | 60/716 |
| 2015/0082804 | A1* | 3/2015 | Charrier | F02K 3/115 |
| | | | | 60/785 |

OTHER PUBLICATIONS

International Search Report and Written Opinion dated May 19, 2015 in Application No. PCT/US2014/053190.

* cited by examiner

US 10,017,269 B2

SYSTEMS FOR GENERATING AUXILIARY ELECTRICAL POWER FOR JET AIRCRAFT PROPULSION SYSTEMS

CROSS-REFERENCE TO RELATED APPLICATIONS

This application is a continuation of, claims priority to and the benefit of, PCT/US2014/053190 filed on Aug. 28, 2014 and entitled "SYSTEMS FOR GENERATING AUXILLARY ELECTRICAL POWER FOR JET AIRCRAFT PROPULSION SYSTEMS," which claims priority from U.S. Provisional Application No. 61/878,494 filed on Sep. 16, 2013 and entitled "SYSTEMS FOR GENERATING AUXILLARY ELECTRICAL POWER FOR JET AIRCRAFT PROPULSION SYSTEMS." Both of the aforementioned applications are incorporated herein by reference in their entirety.

FIELD OF INVENTION

The present disclosure relates to electrical power, and more particularly, to an auxiliary electrical power system for use with a jet aircraft propulsion system.

BACKGROUND OF THE INVENTION

Jet aircraft propulsion systems (e.g., a gas turbine engine coupled to a nacelle) generate large amounts of heat energy. A variety of cooling systems are available to cool these systems. For example, propulsion systems may be cooled by air cooling systems, radiative cooling systems, and other like cooling systems.

SUMMARY OF THE INVENTION

An aircraft jet propulsion system is disclosed. The aircraft jet propulsion system may comprise a thermoelectric generator array ("TEG array") coupled to a portion of the aircraft jet propulsion system, wherein the TEG array converts heat energy to electrical energy. The aircraft jet propulsion system may also comprise a TEG array that converts heat energy to electrical energy and supplies the electrical energy to, a power supply. The power supply may supply power to the aircraft jet propulsion system. The aircraft jet propulsion system may comprise an alternator that generates less electrical energy than the amount of electrical energy associated with the electrical needs of the aircraft jet propulsion system. The TEG array may supplement the energy generated by the alternator. In various embodiments, the energy generated by the TEG array and the energy generated by the alternator may be sufficient to fulfill the electricity needs of the aircraft jet propulsion system and/or the electrical energy generated by the TEG array may be sufficient to fulfill the electricity needs of the aircraft jet propulsion system.

In various embodiments, the TEG array may be coupled to an exhaust portion of the aircraft jet propulsion system, and the exhaust portion may comprise an exhaust nozzle. The TEG array may be coupled to any of: an outer surface of an inner fixed structure ("IFS"), an inner surface of a nacelle, between a heat blanket and an inner surface of a nacelle, to an outer surface of a heat blanket mounted to an inner surface of a nacelle, an air inlet, an air inlet outboard of an anti-ice system, and the like.

The TEG array may comprise a plurality of TEGs electrically coupled in series and/or a plurality of sets of TEGs, each set electrically coupled in parallel. The TEG array may comprise six sets of TEGs, each set electrically coupled in parallel. The TEG array may comprise six TEGs coupled in series. The TEG array may, in various embodiments, generate from about 20 Volts to about 50 Volts and from about 1 W to about 500 W.

A TEG array is disclosed. In various embodiments, the TEG array may comprise a first set of thermoelectric generators coupled in series and/or a second set of TEGs coupled in series, wherein the first set of TEGs and the second TEGs may be coupled in parallel.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the inventions, it should be understood that other embodiments may be realized and that logical, chemical and mechanical changes may be made without departing from the spirit and scope of the inventions. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

As used herein, "aft" refers to the direction associated with the tail (e.g., the back end) of an aircraft, or generally, to the direction of exhaust of the gas turbine. As used herein, "forward" refers to the direction associated with the nose (e.g., the front end) of an aircraft, or generally, to the direction of flight or motion.

As described above, jet aircraft propulsion systems generate large amounts of heat energy. A variety of cooling systems are available to cool these propulsion systems. For example, propulsion systems may be cooled by air cooling systems, radiative cooling systems, and other like cooling systems. In operation, however, these cooling systems may bleed large amounts of heat energy away from the aircraft propulsion system, though the heat energy is largely dissipated as heat. Specifically, these systems may not recapture heat energy generated by the propulsion system during operation so that the heat energy may be harnessed for useful work.

Figure 1:
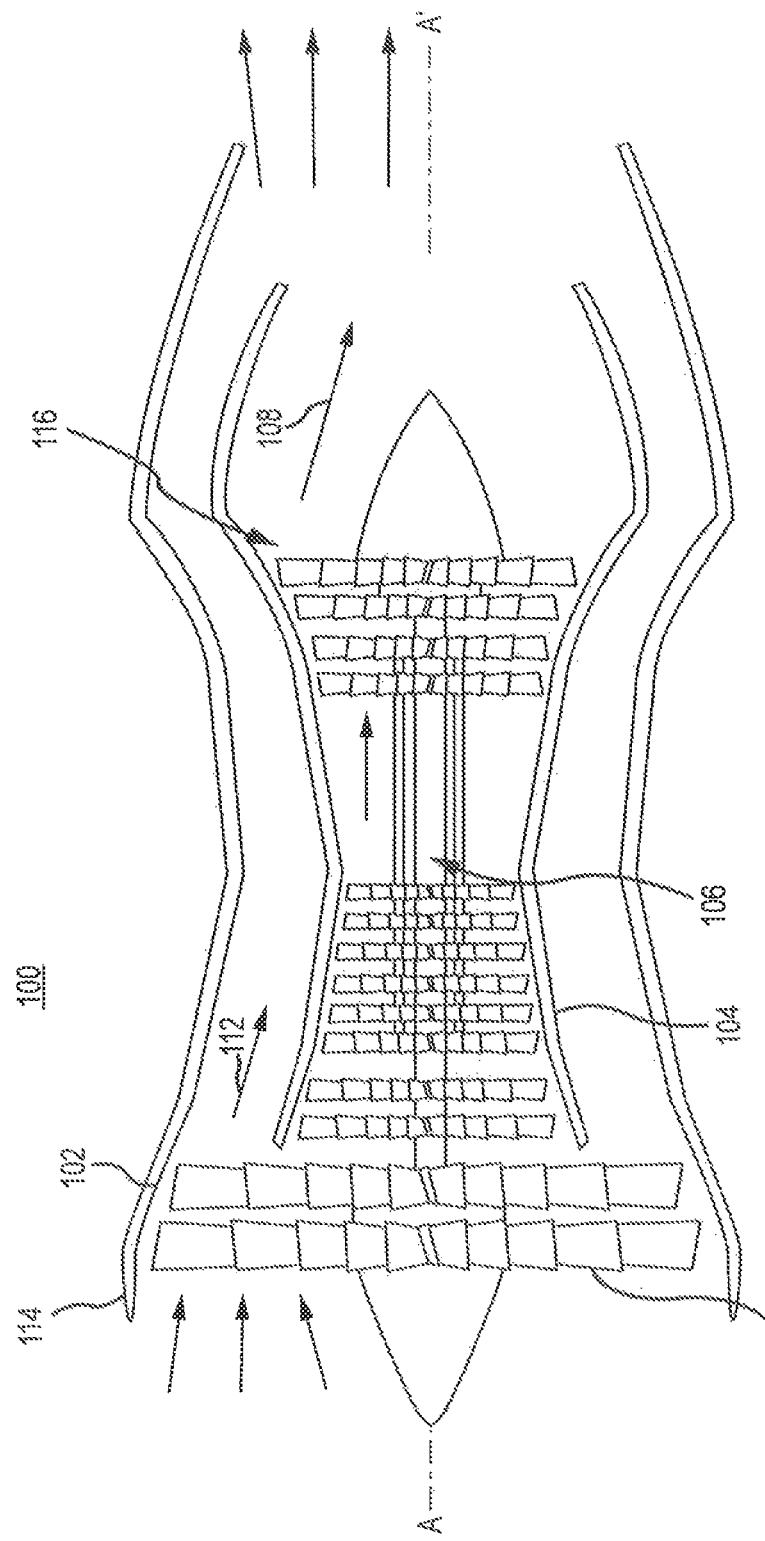
FIG. 1 illustrates, in accordance with various embodiments, a cross-sectional view of a turbofan engine.

With reference to FIG. 1, an aircraft propulsion system 100 is shown and may generally comprise a nacelle 102 comprising an inner fixed structure ("IFS") 104. The aircraft propulsion system 100 may generally extend from forward to aft along the axis A-A', with point A being forward of point A' and point A' being aft of point A In flight, air from point A may flow around and/or through aircraft propulsion system 100 in the direction from point A to point A'. The nacelle 102 may define an outer airflow surface of the aircraft propulsion system 100. The nacelle 102 may include an air inlet 114 through which air may enter aircraft propulsion system 100. An anti-ice system (not shown, and which may heat the air inlet to melt ice) may be disposed within the air inlet 114. The IFS 104 may define an inner airflow surface of the aircraft propulsion system 100. The IFS 104 may be disposed coaxially to engine core 106. The engine core 106 may burn a hydrocarbon fuel in the presence of compressed air to generate exhaust gas 108. The exhaust gas 108 may be expanded across a turbine 116 to drive turbofan 110 at the forward portion of the aircraft propulsion system 100. The turbofan 110 may rotate to generate bypass fan airflow 112 between an interior surface of the nacelle 102 and an exterior surface of the IFS 104.

Figure 2:
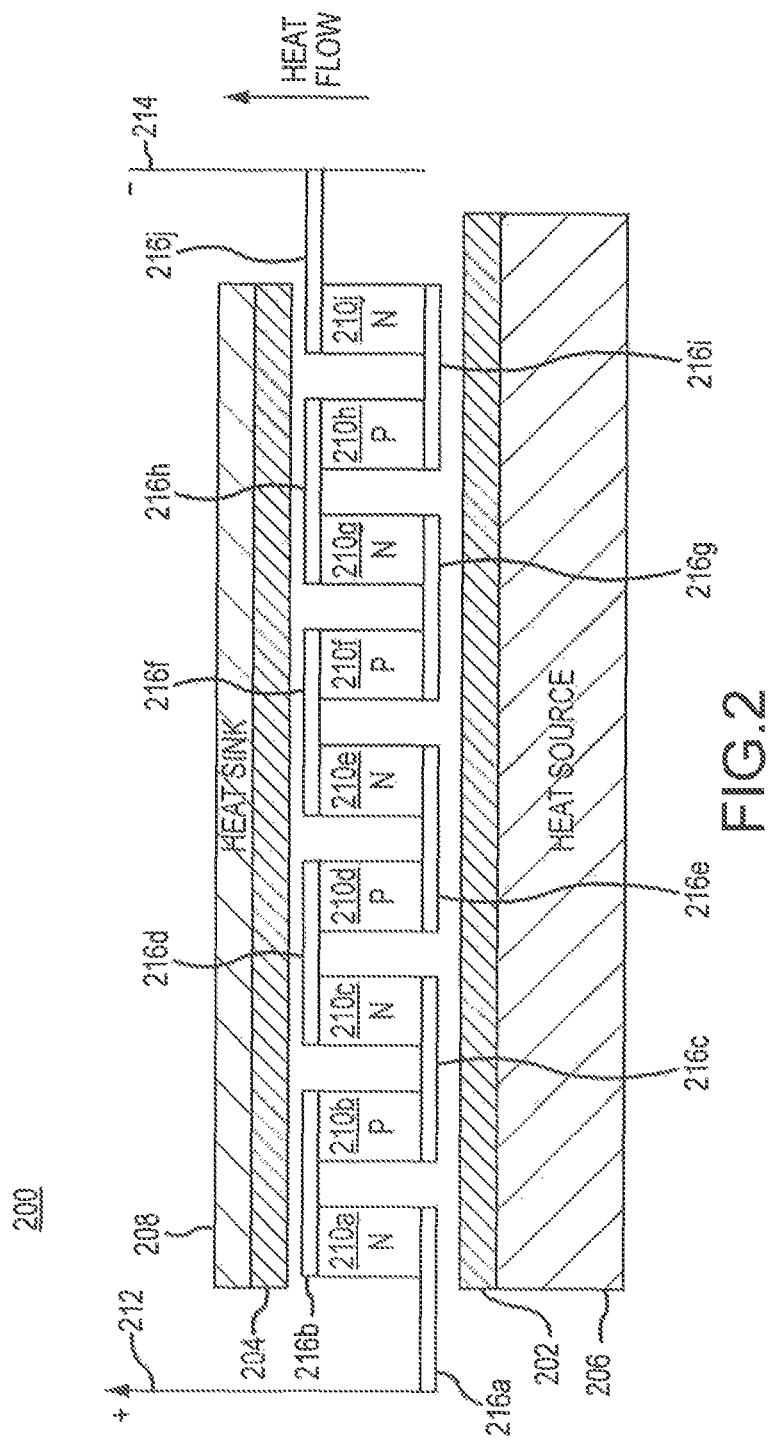
FIG. 2 illustrates, in accordance with various embodiments, a cross-sectional view of a TEG.

With reference to FIG. 2, a thermoelectric generator ("TEG") may be coupled to one or more portions of aircraft propulsion system 100 to recapture heat energy generated by aircraft propulsion system 100. Referring to FIG. 2, although TEGs may vary in the construction and/or composition, TEG 200 may generally comprise first substrate 202 and a second substrate 204. The first substrate 202 may comprise any substrate capable of conducting heat, such as a metallic or ceramic wafer. The second substrate 204 may comprise any substrate capable of conducting heat, such as a metallic or ceramic wafer. The first substrate 202 may be in thermal contact with a heat source 206. Thermal contact, as used herein, may mean that two objects may exchange heat. Heat may be exchanged by convection, conduction, and/or radiation. The second substrate 204 may be in contact with heat sink 208 and/or, in general, with any material or surface that is configured to dissipate heat. The heat source 206 may generate energy as heat, while the heat sink 208 may absorb and/or dissipate energy as heat.

A plurality of thermoelectric semiconductors 210a-210i may be situated or laminated between the first substrate 202 and the second substrate 204. Each thermoelectric semiconductor 210a-210i may comprise either of an n-type material (e.g., 210a, 210c, 210e, 210g, and 210i) or a p-type material (e.g., 210b, 210d, 210f, and 210f). Each thermoelectric semiconductor 210a-210i may be electrically coupled through a respective electrical interconnect 216a-216j. Thus, each thermoelectric semiconductor 210a-210i may be thermally coupled in parallel and electrically coupled in series and together form TEG 200.

An n-type material may comprise a semiconductor doped with an electron donating material or impurity. A p-type material may comprise a semiconductor doped with an electron accepting material or impurity. An electron donating impurity may contribute free electrons to the semiconductor. These electrons may move within the semiconductor. An electron accepting impurity may contribute atoms capable of accepting electrons to the semiconductor. The absence of an electron in the valence band of an electron accepting impurity may be referred to as a "hole." A hole may function as charge carrier that may move within the semiconductor.

n-type and p-type materials may comprise a variety of semiconducting materials, and all are contemplated by this disclosure. However, in various embodiments, an n-type material may comprise an intrinsic semiconductor (such as Silicon, Germanium, Aluminum phosphide, Aluminum arsenide, Gallium arsenide, Gallium nitride, and the like) doped with any impurity that donates electrons (e.g., Phosphorous, Arsenic, Selenium, Tellurium, Silicon, Germanium, and the like). A p-type material may comprise an intrinsic semiconductor doped with any impurity that accepts electrons (e.g., Boron, Aluminum, Beryllium, Zinc, Cadmium, Silicon, Germanium, and the like).

In operation, heat energy from the heat source 206 may be absorbed by the first substrate 202 and rejected, or dissipated, by the second substrate 204. The temperature gradient between the heat source 206 and the heat sink 208 may drive electrons (in the n-type material) and/or holes (in the p-type material) through each material. Thus, an electric current may flow in the direction of heat flow, as depicted in FIG. 2. An external electrical connection comprising a positive contact 212 and a negative contact 214 may conduct electrical current generated by TEG 200 to an external circuit. In an embodiment, TEG 200 may utilize a thermoelectric effect (e.g., the Seebeck effect) to convert heat energy to electrical energy, however, it will be understood by those of ordinary skill in the art that any method of converting het energy into electric energy may be used.

Figure 3:
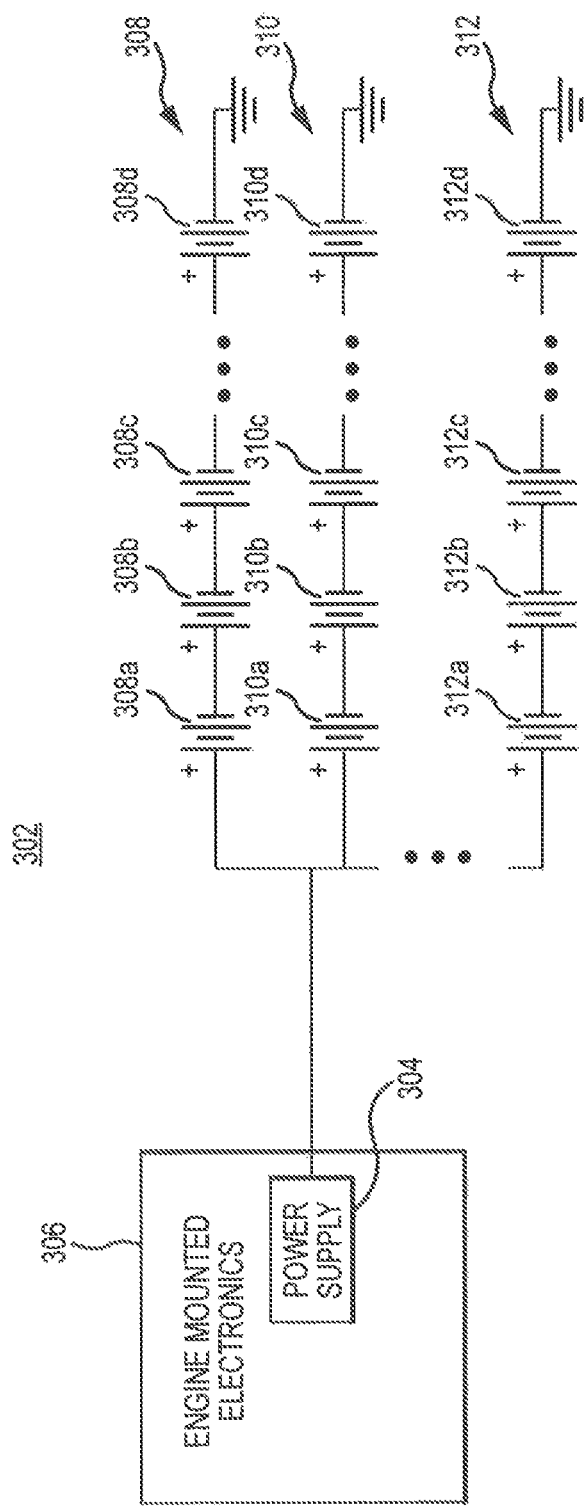
FIG. 3 illustrates, in accordance with various embodiments, a circuit diagram of a TEG array.

Thus, the TEG 200 (or a TEG array comprising a plurality of TEGs 200, as described below) may be coupled or situated between any two surfaces between which a temperature gradient exists to generate electrical energy. For instance, TEG 200 may be situated between a first "hot" surface in a jet aircraft propulsion system and a second "cool" surface of the propulsion system, where the terms "hot" and "cool" are simply relative to one another during operation and between the two, define a temperature gradient. Thus, TEG 200 may recapture heat energy generated by a jet aircraft propulsion system Therefore, with reference to FIG. 3, a TEG array 302 is shown. The TEG array 302 may be electrically coupled to a power supply 304, which may receive the output generated by TEG array 302 to supply power to engine mounted electronics 306 (as an example). In general, TEG 200 and/or TEG array 302 may be expected to generate any suitable voltage, current, and/or power. For example, in various embodiments, a TEG 200 may be expected to generate between two and five Volts and between one and four Amperes. Thus, although the electrical energy generated by a single TEG 200 may be useful for certain purposes, in other circumstances, greater electrical output may be generated by TEG array 302.

To this end, the TEG array 302 may comprise a plurality of sets of TEGs, e.g., sets 308, 310, and 312. Set 308 may comprise TEGs 308a-308d. Set 310 may comprise TEGs 310a-310d. Set 312 may comprise TEGs 312a-312d. Sets 308, 310, and 312 may be electrically coupled in parallel with each other. Further, each of TEGs 308a-308d may be electrically connected in series with each other. Likewise, each of TEGs 310a-310d may be electrically connected in series with each other, and each of TEGs 312a-312d may be electrically connected in series with each other.

In various embodiments, although three sets 308, 310, and 312 of four TEGs 308a-308d, 310a-310d, and 312a-312d each are shown, any number of TEGs may be coupled in series, and any number of sets of series coupled TEGs may be coupled in parallel to form a TEG array. In various embodiments, and as explained in additional detail below, six TEGs may be electrically coupled in series. In addition, in various embodiments, six sets of series coupled TEGs may additionally form a TEG array.

Voltage adds in series coupled voltage sources. Therefore, in operation, TEG array 302 may generate an output voltage that is the sum of the voltages generated by a particular set of series coupled TEGs (e.g., any of sets 308, 310, or 312). Thus, assuming an output voltage per TEG of approximately four to five Volts, a set of four TEGs coupled in series may be expected to produce between sixteen and twenty Volts. Similarly, a set of six TEGs coupled in series may be expected to produce between twenty-four and thirty Volts. In various embodiments, a TEG array 302 coupled in series may be expected to produce approximately twenty-eight Volts. However, a variety of other voltages may be achieved, depending upon the TEG selected, the number of TEGs, temperature differential, and the like.

Current adds in parallel coupled voltage sources. Therefore, in operation, a TEG array 302 may generate an output current that is the sum of each of the sets 308, 310, and 312 of TEGs. Assuming an output current of between one and four Amps, the TEG array 302 may be expected to produce between three and twelve Amps of current. However, a variety of other amperages may be achieved, depending upon the TEG selected, the number of TEGs, temperature differential, and the like.

Approximately ten to fifty Volts (e.g., twenty-eight Volts), two to twenty amps, and fifty to five-hundred Watts may be typically required to power the electrical systems associated with an aircraft propulsion system 100. Typically, an alternator (e.g., a permanent magnet alternator or "PMA") is used to generate the electrical output needed to power the electrical systems associated with an aircraft propulsion system 100. The PMA is situated within a gearbox within aircraft propulsion system 100. Thus, the mechanical energy generated by aircraft propulsion system 100 is used to operate the PMA. This, in turn, leaches mechanical energy from aircraft propulsion system 100. In addition, the PMA adds weight to the overall aircraft propulsion system 100 and adds a mechanical load to the total load on the gearbox.

Thus, a TEG array (e.g., array 302) may be added to the aircraft propulsion system 100, as needed and/or where possible to recapture heat energy generated by the aircraft propulsion system 100. In various embodiments, a TEG array, such as the array 302 may be implemented to generate all or a portion of the electricity needed to operate the electrical systems associated with aircraft propulsion system 100. Where a TEG array generates all the electricity needed, a PMA may be altogether excluded from the aircraft propulsion system 100. Similarly, where a TEG array generates only a portion of the voltage and current needed to power aircraft propulsion system 100, a PMA sized for a much lower (than typical) current draw may be implemented, thereby reducing the overall weight of the power generation system.

Thus, TEG array 302 may be added to a propulsion system 100 to achieve a variety of advantages. Among these advantages, a TEG array 200 may save weight (in that the PMA may be removed from aircraft propulsion system 100 or reduced in size), reduce load, recapture what would otherwise constitute wasted heat generated by the system 100, reduce a mechanical load on the gearbox, and add reliability to aircraft propulsion system 100. With respect to the last advantage (reliability), TEGs 200, which are solid state devices, do not include moving parts and are, in general, considered quite reliable. Thus, a TEG 200 may offer a reliability advantage of a moving or rotating power generating assembly, such as a PMA.

Any suitable portion of aircraft propulsion system 100 may be equipped with a TEG array 302. For example, any portion of aircraft propulsion system 100 in which a temperature gradient exists between a first portion of aircraft propulsion system 100 and a second portion of aircraft propulsion system 100 may be equipped with a TEG array 302. Several example portions of aircraft propulsion system 100 which may be equipped with a TEG array 302 are shown in FIGS. 4, 5, and 6.

Figure 4:
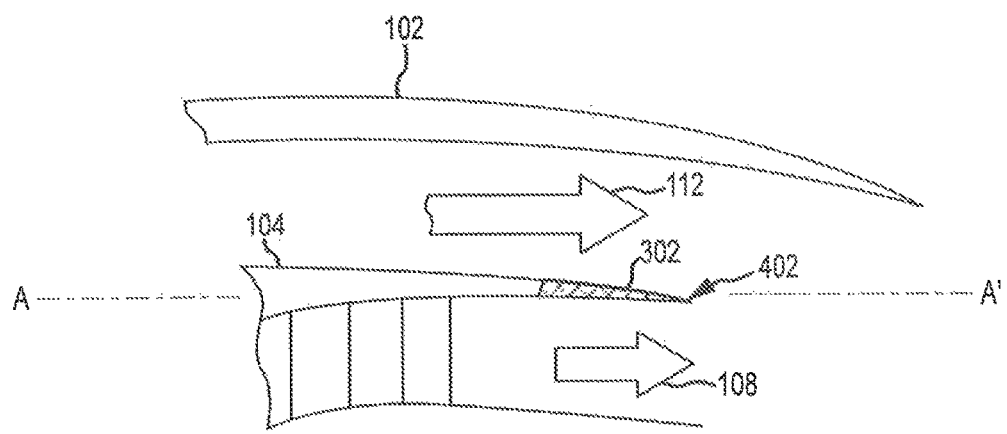
FIG. 4 illustrates, in accordance with various embodiments, a cross-sectional view of an exhaust portion of a jet aircraft propulsion system equipped with a TEG array.

With reference to FIG. 4, an exhaust portion of aircraft propulsion system 100 may be equipped with a TEG array 302. Specifically, a TEG array may be placed in contact with or coupled to the IFS 104 toward an aft (exhaust) portion of the IFS 104, e.g., the exhaust nozzle 402. The temperature gradient between the exhaust gas 108 and the bypass airflow 112 may be significant. Thus, placement of the TEG array 302 on the exhaust nozzle 402 separating these flows may result in significant energy production.

Figure 5:
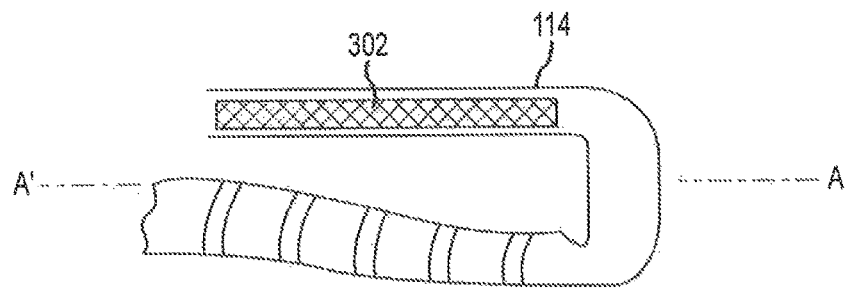
FIG. 5 illustrates, in accordance with various embodiments, a fan cowl anti-ice system of a jet aircraft propulsion system equipped with a TEG array.

With reference to FIG. 5, an air inlet 114 may be equipped with a TEG array 302. As shown, the air inlet 114 (in cross-section) may be equipped with a TEG array. As described herein, an air inlet 114 may include an anti-ice system, which may heat the air inlet substantially to melt ice that develops around the air inlet 114. The air entering the air inlet 114 is ambient air. Thus, a large temperature gradient may exist between the air inlet 114 and incoming air, making the air inlet (in particular the anti-ice portion of the air inlet 114) a suitable location for placement of a TEG array 302.

Figure 6:
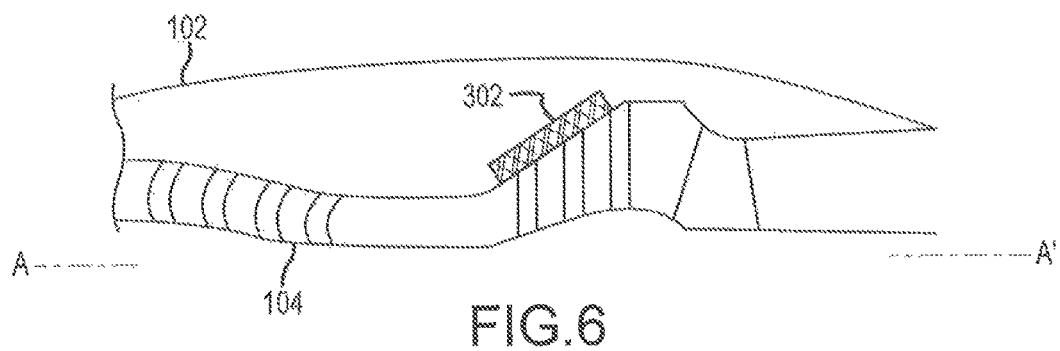
FIG. 6 illustrates, in accordance with various embodiments, a cross-sectional view of an inner fixed structure of a jet aircraft propulsion system equipped with a TEG array.

With reference to FIG. 6, an IFS 104 may be equipped with a TEG array 302. As described herein, the IFS 104 may be disposed coaxially about an engine core, which may operate at extremely high temperatures. The nacelle 102 may surround the IFS 104, and cooler bypass air may flow over the outer surface of the IFS 104. Thus, a significant temperature gradient exists between the outer surface of the IFS 104 and the bypass airflow flowing around the IFS 104. Accordingly, a TEG array 302 may generate significant electrical power in this area of the aircraft propulsion system 100.

Further, and more generally as described herein, a TEG array 302 may be suitably equipped on any portion of aircraft propulsion system 100 that experiences a temperature gradient. For instance, in addition to the examples discussed above, TEG arrays 302 may be placed on any hot bleed air ducts (e.g., the exhaust duct), on any engine coolers (e.g., on any air cooled or oil cooled surface of cooling system), between a heat blanket and an inner surface of the nacelle 102, on an outer surface of a heat blanket mounted to an inner surface of the nacelle 102, and the like.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

I claim:

1. An aircraft jet propulsion system comprising:
a thermoelectric generator array ("TEG" array) coupled to an outer surface of a heat blanket mounted to an inner surface of a nacelle, wherein the TEG array converts heat energy to electrical energy, wherein the electrical energy is supplied to the aircraft jet propulsion system.

2. The aircraft jet propulsion system of claim 1, further comprising an alternator that generates less energy than is associated with the electricity for operating the aircraft jet propulsion system.

3. The aircraft jet propulsion system of claim 2, wherein the TEG array supplements the energy generated by the alternator.

4. The aircraft jet propulsion system of claim 3, wherein the energy generated by the TEG array and the energy generated by the alternator are sufficient to electrically power the aircraft jet propulsion system.

5. The aircraft jet propulsion system of claim 1, wherein the electrical energy generated by the TEG array is sufficient to electrically power the aircraft jet propulsion system.

6. The aircraft jet propulsion system of claim 1, wherein the TEG array is coupled to an exhaust portion of the aircraft jet propulsion system.

7. The aircraft jet propulsion system of claim 6, wherein the exhaust portion is an exhaust nozzle.

8. The aircraft jet propulsion system of claim 1, further comprising a TEG array coupled to an outer surface of an inner fixed structure ("IFS").

9. The aircraft jet propulsion system of claim 1, further comprising a TEG array is coupled to an inner surface of a nacelle.

10. The aircraft jet propulsion system of claim 1, further comprising a TEG array coupled to an air inlet.

11. The aircraft jet propulsion system of claim 10, wherein the TEG array is coupled to an air inlet outboard of an anti-ice system.

12. The aircraft jet propulsion system of claim 1, wherein the TEG array comprises a plurality of thermoelectric generators ("TEGs") electrically coupled in series.

13. The aircraft jet propulsion system of claim 1, wherein the TEG array comprises a plurality of sets of TEGs, each set electrically coupled in parallel.

14. The aircraft jet propulsion system of claim 1, wherein the TEG array comprises six sets of TEGs, each set electrically coupled in parallel.

15. The aircraft jet propulsion system of claim 1, wherein the TEG array comprises six TEGs coupled in series.

16. The aircraft jet propulsion system of claim 1, wherein the TEG array generates approximately 28 Volts.

17. A thermoelectric generator array ("TEG" array) comprising:
a first set of thermoelectric generators ("TEGs") coupled in series; and
a second set of TEGs coupled in series, wherein the first set of TEGs and the second TEGs are coupled in parallel, wherein the TEG array recaptures heat energy generated by a turbofan engine and is coupled to an outer surface of a heat blanket mounted to an inner surface of a nacelle.

* * * * *